(12) United States Patent
Park et al.

(10) Patent No.: US 9,812,665 B2
(45) Date of Patent: Nov. 7, 2017

(54) DISPLAY APPARATUS, AND APPARATUS AND METHOD OF MANUFACTURING THE SAME

(71) Applicant: Samsung Display Co., Ltd., Yongin-si (KR)

(72) Inventors: Illsoo Park, Yongin-si (KR); Seulong Kim, Yongin-si (KR); Sunghun Lee, Yongin-si (KR); Jaeyong Lee, Yongin-si (KR); Mugyeom Kim, Yongin-si (KR); Hyosup Shin, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/253,259

(22) Filed: Aug. 31, 2016

(65) Prior Publication Data

US 2017/0062758 A1    Mar. 2, 2017

(30) Foreign Application Priority Data

Sep. 2, 2015 (KR) .................. 10-2015-0124228
Jan. 18, 2016 (KR) .................. 10-2016-0005977
Aug. 3, 2016 (KR) .................. 10-2016-0099067

(51) Int. Cl.
*H01L 51/54* (2006.01)
*H01L 51/52* (2006.01)
(Continued)

(52) U.S. Cl.
CPC ........ *H01L 51/5237* (2013.01); *H01L 51/001* (2013.01); *H01L 51/5036* (2013.01); *H01L 51/56* (2013.01)

(58) Field of Classification Search
CPC ............... H01L 51/001; H01L 51/5036; H01L 51/5237; H01L 51/56
See application file for complete search history.

(56) References Cited

U.S. PATENT DOCUMENTS

2004/0142098 A1    7/2004   Ghosh et al.
2007/0188083 A1*   8/2007   Iwakuma ............ H01L 51/5036
                                                        313/506
(Continued)

FOREIGN PATENT DOCUMENTS

JP    2004-228088    8/2004
JP    2012-195140    10/2012
(Continued)

OTHER PUBLICATIONS

Park, et al., "The methodology for prediction of mass production using premixed organic molecules", The 5th Samsung Display Technology Symposium, 4 pages, Sep. 14, 2015.

(Continued)

*Primary Examiner* — Allan R Wilson
(74) *Attorney, Agent, or Firm* — H.C. Park & Associates, PLC (57) ABSTRACT

A display apparatus includes an emission portion disposed on a substrate and comprising an intermediate layer; and an encapsulation portion sealing the emission portion by overlapping the emission portion, wherein the intermediate layer comprises at least two organic materials, the organic materials having different phase transition temperatures at a first saturated vapor pressure in a range from $5 \times 10^{-4}$ Torr to $3 \times 10^{-2}$ Torr, and the difference between the phase transition temperatures being less than or equal to 5° C.

19 Claims, 4 Drawing Sheets

(51) Int. Cl.
*H01L 51/50* (2006.01)
*H01L 51/56* (2006.01)
*H01L 51/00* (2006.01)

(56) References Cited

U.S. PATENT DOCUMENTS

| | | | |
|---|---|---|---|
| 2011/0248247 A1* | 10/2011 | Matsumoto | C09K 11/06 257/40 |
| 2012/0164772 A1 | 6/2012 | Lee | |
| 2013/0256639 A1* | 10/2013 | Kambe | H01L 51/5096 257/40 |
| 2015/0053938 A1* | 2/2015 | Zeng | H01L 51/0054 257/40 |
| 2016/0133841 A1* | 5/2016 | Sun | H01L 51/0026 438/46 |

FOREIGN PATENT DOCUMENTS

| | | |
|---|---|---|
| KR | 10-2012-0073702 | 7/2012 |
| KR | 10-2015-0046750 | 4/2015 |

OTHER PUBLICATIONS

Yoshikazu Takahashi et al., "Determination of Evaporation Rate and Vapor Pressure of Organic Monomers Used for Vapor Deposition Polymerization", Jpn. J. Appl. Phys. vol. 32, Part 2, No. 6B, Jun. 15, 1993, pp. L875-L878.

Kiyoshi Yase et al., "Evaporation Rate and Saturated Vapor Pressure of Functional Organic Materials", Jpn. J. Appl. Phys. vol. 34, Part 1, No. 2A, Feb. 1995, pp. 636-637.

* cited by examiner

DISPLAY APPARATUS, AND APPARATUS AND METHOD OF MANUFACTURING THE SAME

CROSS-REFERENCE TO RELATED APPLICATIONS

This application claims priority from and the benefit of Korean Patent Application No. 10-2015-0124228, filed on Sep. 2, 2015, Korean Patent Application No. 10-2016-0005977, filed on Jan. 18, 2016, and Korean Patent Application No. 10-2016-0099067, filed on Aug. 3, 2016, all of which are hereby incorporated by reference for all purposes as if fully set forth herein.

BACKGROUND

Field

Exemplary embodiments relate to a display apparatus, and an apparatus and method of manufacturing the display apparatus.

Discussion of the Background

A mobile electronic device, such as a mobile phone and a tablet PC, is widely used.

The mobile electronic device may include a display apparatus that provides users with visual information, such as still or moving images, to support various functions. Recently, components to drive a display apparatus have been miniaturized, allowing the display apparatus to occupy a larger portion of an electronic device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display apparatus, and an apparatus and method of manufacturing the display apparatus.

Additional aspects will be set forth in the detailed description which follows, and, in part, will be apparent from the disclosure, or may be learned by practice of the inventive concept.

An exemplary embodiment discloses a display apparatus that includes: an emission portion disposed on a substrate, the emission portion including an intermediate layer; and an encapsulation portion sealing the emission portion by overlapping the emission portion, wherein the intermediate layer includes at least two organic materials, the organic materials have different phase transition temperatures at a first saturated vapor pressure in a range from $5\times10^{-4}$ Torr to $3\times10^{-2}$ Torr, and the difference between the phase transition temperatures is less than or equal to 5° C.

An exemplary embodiment also discloses an apparatus for manufacturing a display apparatus that includes: a chamber including a support for a first substrate; and a deposition source supplier provided to face the first substrate, the deposition source supplier providing at least two organic materials to the first substrate, wherein the at least two organic materials have different phase transition temperatures at a first saturated vapor pressure in a range from $5\times10^{-4}$ Torr to $3\times10^{-2}$ Torr, and the difference between the phase transition temperatures is less than or equal to 5° C.

Another exemplary embodiment discloses a method of manufacturing a display apparatus that includes: allowing a first substrate to enter a chamber; heating a deposition source supplier to supply at least two organic materials inside the chamber; depositing the at least two organic materials on the first substrate to form an intermediate layer, wherein the at least two organic materials have different phase transition temperatures at a first saturated vapor pressure in a range from $5\times10^{-4}$ Torr to $3\times10^{-2}$ Torr, and the difference between the phase transition temperatures is less than or equal to 5° C.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 1:
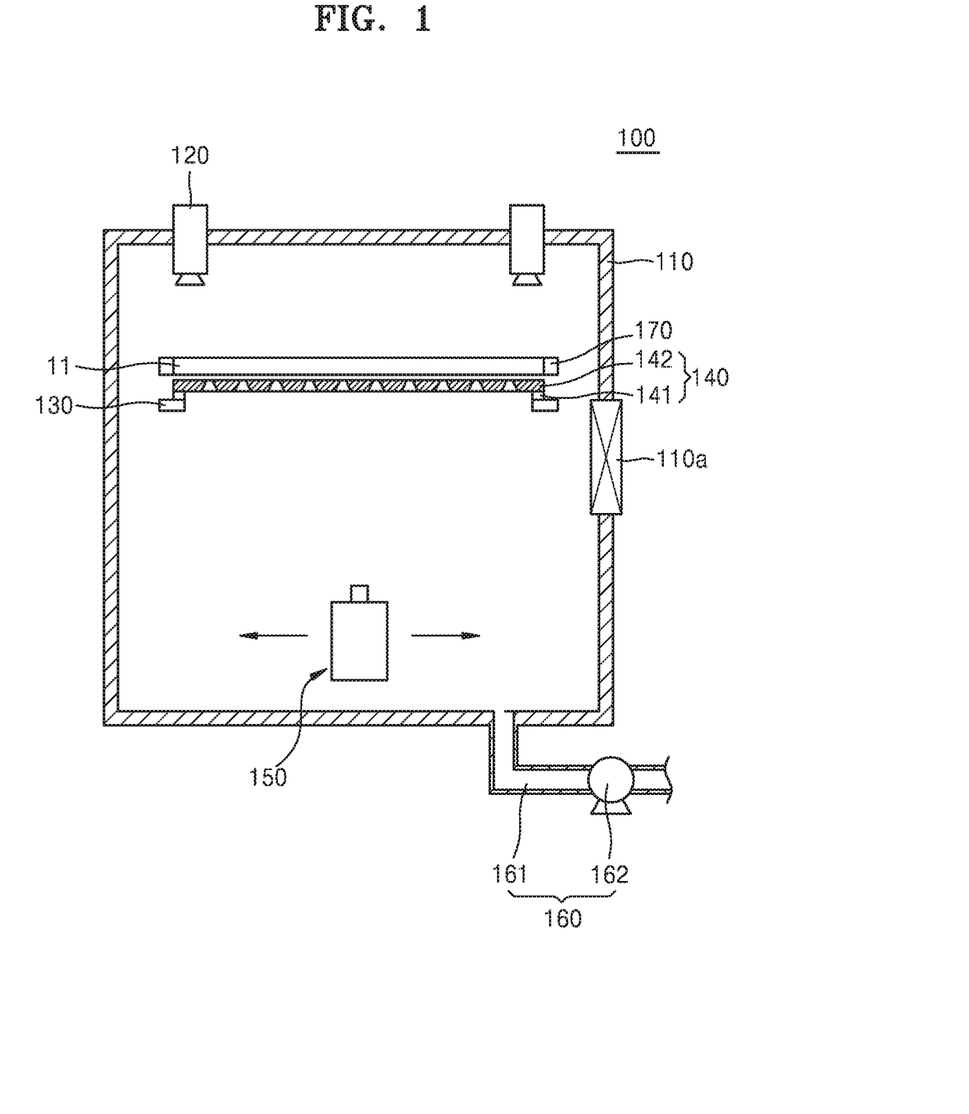
FIG. 1 illustrates a schematic diagram of an apparatus for manufacturing a display apparatus according to one or more exemplary embodiments.
Figure 2:
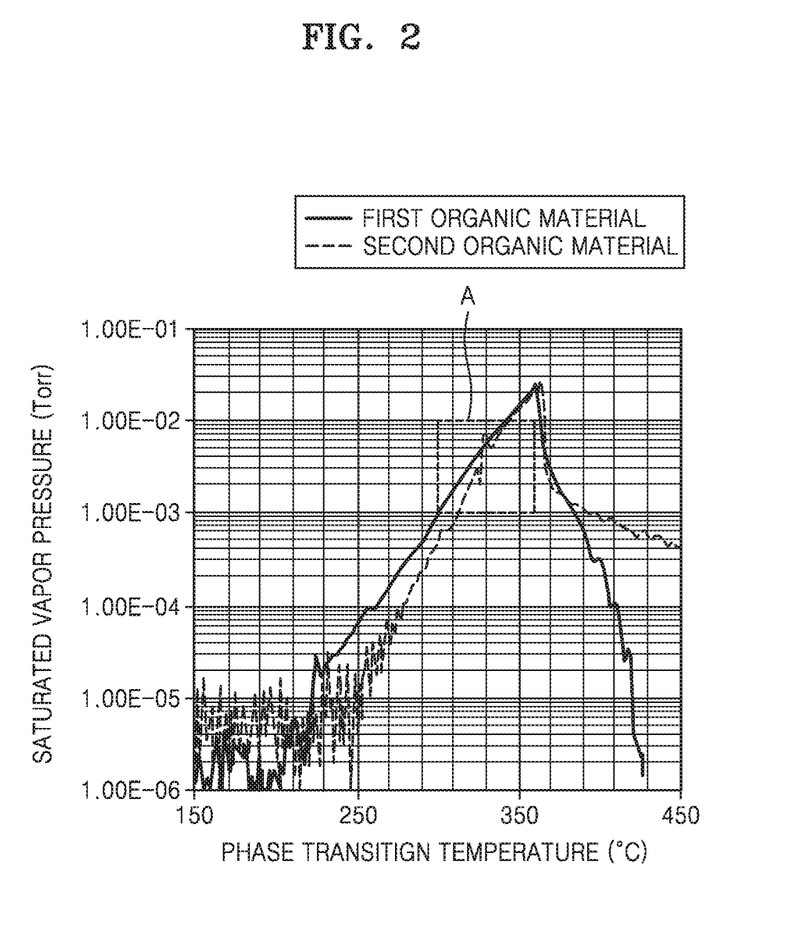
FIG. 2 is a graph of a saturated vapor pressure with respect to the phase transition temperature of the organic materials used in the apparatus of FIG. 1.
Figure 3:
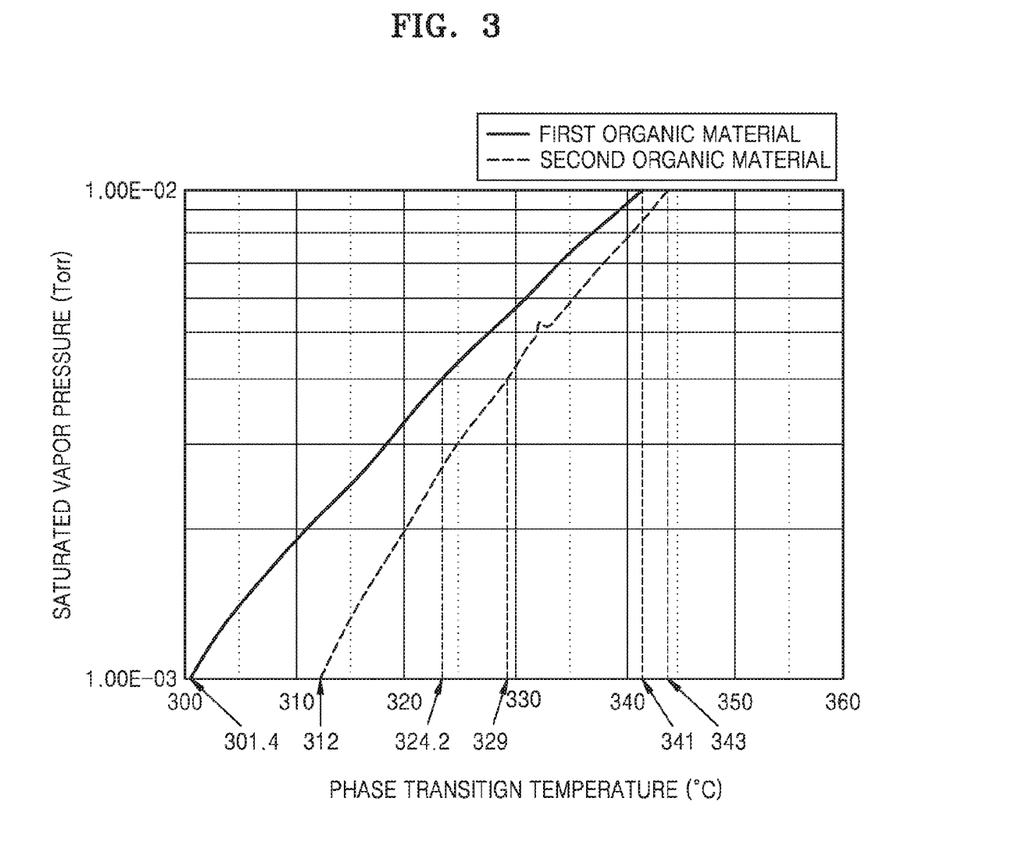
FIG. 3 is an enlarged view of portion A shown in FIG. 2.
Figure 4:
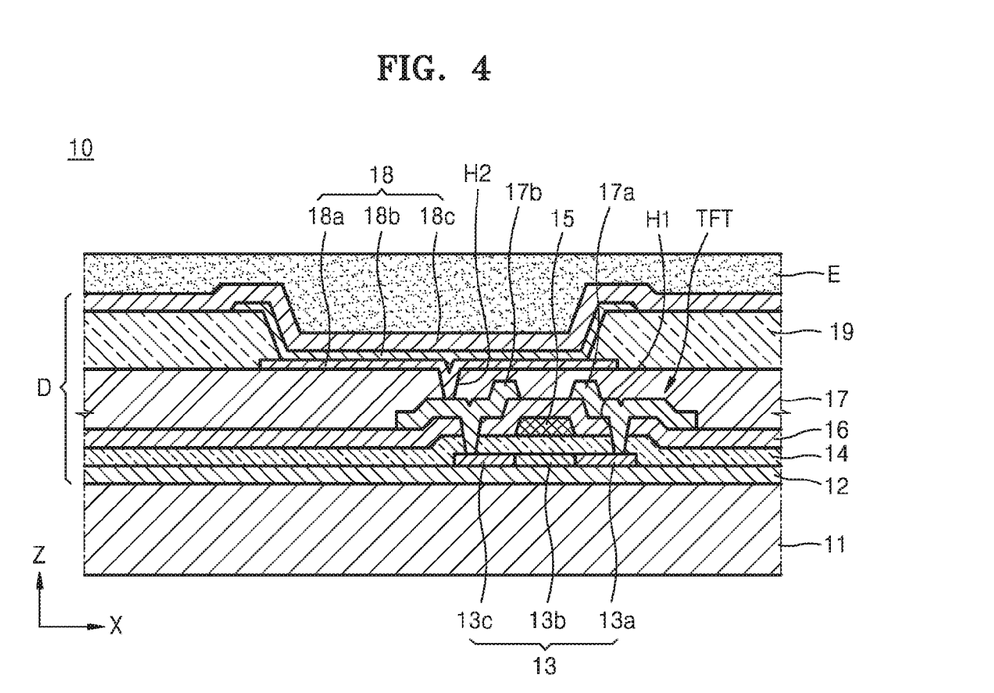
FIG. 4 is a cross-sectional view of a portion of an exemplary embodiment of a display apparatus manufactured by using the apparatus of FIG. 1.

FIG. 1 shows a schematic diagram of an apparatus for manufacturing a display apparatus according to one or more exemplary embodiments. FIG. 2 is a graph of a saturated vapor pressure with respect to the phase transition temperature of the organic materials used in the apparatus of FIG. 1. FIG. 3 is an enlarged view of portion A shown in FIG. 2. FIG. 4 is a cross-sectional view of a portion of a display apparatus manufactured by using the apparatus of FIG. 1.

Referring to FIG. 1, an apparatus 100 for manufacturing a display apparatus includes a chamber 110, a substrate support 170 supporting a first substrate 11, a vision unit 120, a mask support 130, a mask assembly 140, a deposition source supplier 150, and a pressure controller 160.

The chamber 110 may have a portion having an opening, and a gate valve 110a may be provided to the opening of the chamber 110 to selectively open or close the chamber 110.

The substrate support 170 may be provided in various forms. In some embodiments, the substrate support 170 may be provided in a shuttle form being movable from outside the chamber 110 to inside the chamber 110. In some embodiments, the substrate support 170 may be provided in the form of a frame fixed inside the chamber 110. In some embodiments, the substrate support 170 may be provided in an electrostatic form inside the chamber 110. However, the substrate support 170 is not limited to these forms, and may be any apparatus or structure that supports the first substrate 11 or fixes the first substrate 11 inside the chamber 110. Hereinafter, for ease of explanation, embodiments will be described herein assuming that the substrate support 170 is in form of a frame fixed inside the chamber 110.

The vision unit 120 may be provided to the chamber 110. In this regard, a camera may be used as the vision unit 120 to photograph at least one of the first substrate 11 and the mask assembly 140.

The mask assembly 140 may be mounted on the mask support 130. After mounting the mask assembly 140, the mask support 130 may change the position of the mask assembly 140. For example, the mask support 130 may include an alignment means (not shown) for moving and aligning the mask assembly 140 in three different directions.

The use of the mask assembly 140 is optional according to a layer to be deposited on the substrate 11. For ease of explanation, however, one or more embodiments in which a deposition process may be performed by using the mask assembly 140 will be described in detail.

In one or more embodiments, the mask assembly 140 may include a mask frame 141. In this embodiment, the mask frame 141 may have an open central portion, and the mask frame 141 may be used alone. In one or more embodiments, the mask assembly 140 may include a mask frame 141 and a mask sheet 142. The mask assembly 140 may further include a reinforcing member (not shown) provided to the mask frame 141. For ease of explanation, an embodiment in which the mask assembly 140 includes the mask frame 141, the mask sheet 142, and the reinforcing member will be described in detail.

The mask frame 141 may have an opening, and may be similar to a window-frame. In some embodiments, the mask sheet 142 may have a pattern including openings. The mask sheet 142 may have a plate or a plurality of elongated members and may be combined to the mask frame 141 while being extended.

The reinforcing member may be provided in various forms. For example, the reinforcing member provided to the mask frame 141 may be in a bar or plate form. A plurality of reinforcing members may be provided, and some of the reinforcing members may be formed to cross an interior portion of the mask frame 141 to reinforce the rigidity of the mask frame 141. In some embodiments, some of the reinforcing members may be provided on the mask frame 141 and the mask sheet 142 may then be provided to the resultant structure.

In various embodiments, the mask assembly 140 may include the mask frame 141, the mask sheet 142, and a blocking mask (not shown) provided on the mask frame 141. The mask frame 141 and the mask sheet 142 may be substantially the same as the descriptions above. The blocking mask may be provided on the mask frame 141. The blocking mask may be provided in a lattice shape. The mask sheet 142 may be combined with the blocking mask while being extended. However, hereinafter, for ease of explanation, embodiments will be described below assuming that the mask assembly 140 includes the mask frame 141 and the mask sheet 142, and the mask sheet 142 is provided directly on the mask frame 141.

The deposition source supplier 150 may face the mask assembly 140. However, the position of the deposition source supplier 150 may vary depending on an organic material. For example, the deposition source supplier 150 may be disposed on an upper part of the interior of the chamber 110 or on a lower part of the interior of the chamber 110. In some embodiments, the deposition source supplier 150 may be disposed on a side of the interior of the chamber 110. However, for ease of explanation, embodiments will be described below assuming that the deposition source supplier 150 is disposed on a lower part of the interior of the chamber 110.

The deposition source supplier 150 may have a reserving (i.e., empty) portion reserved for an organic material. The deposition source supplier 150 may include a heater (not shown) for heating the organic material. The deposition source supplier 150 may then sublimate or vaporize the organic material by heating the organic material. Once vaporized, the organic material may pass through the mask assembly 140, followed by deposition on a surface of the first substrate 11.

In this regard, the deposition may be performed while the deposition source supplier 150 and the first substrate 11 do not move. In one embodiment, at least one of the deposition source supplier 150 and the first substrate 11 may linearly move. For example, when the deposition source supplier 150 linearly moves in one direction, the first substrate 11 may not move. In one embodiment, when the first substrate 11 linearly moves (or reciprocates) in one direction, the deposition source supplier 150 may not move. In one embodiment, each of the deposition source supplier 150 and the first substrate 11 may reciprocate. Hereinafter, for ease of explanation, embodiments will be provided herein assuming that the deposition is performed while the deposition source supplier 150 reciprocates in one direction.

The organic material may include various materials. The organic material may be deposited on a substrate to form an intermediate layer 18b shown in FIG. 4 of an organic light emitting diode (OLED) 18. For example, at least two different organic materials may be mixed and stored in the deposition source supplier 150. In one embodiment, when the organic material includes a plurality of organic materials, at least one organic material thereof may have a concentration ratio of 0.1% to 50%. Hereinafter, for ease of explanation, embodiments will be provided herein assuming that two organic materials are stored in the deposition source supplier 150. Herein, the two organic materials include a first organic material and a second organic material that is different from the first organic material.

The pressure controller 160 may include a connection pipe 161 and a pump 162 provided to the connection pipe 161. An inner pressure of the chamber 110 may be adjusted by operation of the pump 162. For example, when a deposition process is performed, the pump 162 may maintain the inner pressure of the chamber 110 to be a level approaching a vacuum state. When the first substrate 11 and the mask assembly 140 enter the chamber 110, the pump 162 may control the inner pressure of the chamber 110 to be a level that is the same as the atmospheric pressure.

An operational example of the apparatus 100 will be described below. While the pump 162 maintains the inner pressure of the chamber 110 to be the same as the atmospheric pressure, the gate valve 110a may be opened, and the first substrate 11 and/or the mask assembly 140 may enter the chamber 110. Inside or outside the chamber 110, for example, a robotic arm (not shown) or a shuttle (not shown) may be disposed to move the first substrate 11 and the mask assembly 140 into the chamber 110. Hereinafter, for ease of explanation, embodiments will be provided below assuming that a robotic arm is disposed outside the chamber 110 to move the first substrate 11 and the mask assembly 140 into the chamber 110.

The robotic arm may move the first substrate 11 into the chamber 110 and then, may mount the first substrate 11 on the substrate support 170. The robotic arm may move the mask assembly 140 into the chamber 110 and then mount the mask assembly 140 on the mask support 130.

Once the first substrate 11 and the mask assembly 140 are mounted, the vision unit 120 may capture an image of the first substrate 11 and the mask assembly 140. Each of the first substrate 11 and the mask assembly 140 may have an alignment mark.

The vision unit 120 may transmit the captured image to a controller (not shown), is which then determines whether the first substrate 11 and the mask assembly 140 are located where they are set to be positioned. The controller may determine whether relative positions of the first substrate 11 and the mask assembly 140 are accurate. The controller may be formed as, for example, an electronic circuit or an external terminal, such as a computer.

Once the controller compares positions of the first substrate 11 and the mask assembly 140 with each other and determines that the first substrate 11 is not aligned with the mask assembly 140, the controller may actuate the mask support 130 and control the position of the mask assembly 140.

Once the controller determines that the position of the first substrate 11 has matched with the position of the mask assembly 140, the controller may actuate the deposition source supplier 150 to deposit an organic material on the first substrate 11. At some point after receiving the substrate and prior to actuation of the deposition source supplier, the controller operates the pump 162 to bring the chamber 110 to the desired low pressure for deposition. The deposition source supplier 150 may then be heated to supply at least two organic materials (e.g. the first organic material and the second organic material) inside the chamber 110. At least one of the first substrate 11 and the deposition source supplier 150 may move linearly. Hereinafter, an embodiment in which the deposition source supplier 150 moves linearly will be described in detail. The pump 162 may maintain the inner pressure of the chamber 110 to be a level approaching a vacuum state.

For example, when the deposition source supplier 150 actuates, the first organic material and the second organic material contained in the deposition source supplier 150 may be sublimated or vaporized. At least one of the first organic material and the second organic material may include a vaporizable material that the phase transits from a liquid state to a gas state by vaporization. At least one of the first organic material and the second organic material may include a sublimation material that the phase transits from a solid state to a gas state by sublimation. Hereinafter, for ease of explanation, embodiments will be provided below assuming that each of the first organic material and the second organic material includes a sublimation material.

The first organic material and the second organic material are not limited thereto, and may each vary. The first organic material and the second organic material may each include any material that constitutes the intermediate layer 18b of the OLED 18. Therefore, the intermediate layer 18b may be formed by depositing the at least two organic materials on the first substrate 11 through the mask assembly 140. The first organic material and the second organic material may have different phase transition temperatures, and the difference between the phase transition temperatures is 5° C. or less at a selected saturated vapor pressure (a first saturated vapor pressure) in a range from $5 \times 10^{-4}$ Torr to $3 \times 10^{-2}$ Torr.

For example, the first organic material or the second organic material may be an organic material having a molecular structure represented by Formula 1. The other material may be an organic material having a molecular structure represented by Formula 2. Hereinafter, for ease of explanation, embodiments will be provided below assuming that the first organic material has the molecular structure represented by Formula 1, and the second organic material has the molecular structure represented by Formula 2:

[Formula 1]

[Formula 2]

FIG. 2 is a graph of a saturated vapor pressure with respect to the phase transition temperature of the first organic material having the molecular structure represented by Formula 1 and the second organic material having the molecular structure represented by Formula 2. Referring to FIG. 2, a phase transition temperature of the first organic material at a saturated vapor pressure will be referred to as a first temperature (the solid line), and a phase transition temperature of the second organic material at the same saturated vapor pressure will be referred to as a second temperature (the dotted line). For example, at the saturated vapor pressure of $3 \times 10^{-3}$ Torr, the first temperature may be about 324.2° C. and the second temperature may be about 329° C. Accordingly, the difference between the phase transition temperature of the first organic material and the phase transition temperature of the second organic material, that is, the difference between the first temperature and the second temperature, may be about 4.8° C. When the saturated vapor pressure is $1 \times 10^{-2}$ Torr, the first temperature may be about 341° C. and the second temperature may be about 343° C. Accordingly, the difference between the first temperature and the second temperature may be about 2° C. If the difference between the phase transition temperature of the first organic material and the phase transition temperature of the is second organic material is 5° C. or less, a concentration ratio of the first organic material to the second organic material may be maintained constant. Table 1 shows concentration values of the first organic material and the second organic material when a deposition process is performed by using the first organic material and the second organic material and the phase transition temperature difference is 5° C. or less. A concentration of the first organic material is calculated by dividing a weight of the first organic material by the sum of the first organic material and the second organic material. A concentration of the second organic material is calculated by dividing a weight of the second organic material by the sum of the first organic material and the second organic material. The concentration values of the first organic material and the second organic material are represented by %.

TABLE 1

| Material | Concentration before vaporization (or sublimation) (%) | Concentration when in the form of a deposition film after 200 hours of deposition (%) | Quantity of the residual after 200 hours of deposition (%) |
|---|---|---|---|
| First organic material | 20 | 21.5 | 21.6 |
| Second organic material | 80 | 78.5 | 78.4 |

Referring the results shown above, it is seen that, originally, a concentration of the first organic material and a concentration of the second organic material contained in the deposition source supplier 150 are 20% and 80%, respectively. After deposition, the concentration of the first organic material and the concentration of the second organic material in a deposition layer (or intermediate layer 18b) formed on the first substrate 11 are 21.5% and 78.5%, respectively. That is, it is seen that the concentration of the first organic material and the concentration of the second organic material originally contained in the deposition source supplier 150 are substantially similar to those in the deposition layer after deposition. In this case, the difference between the concentration of the first organic material originally contained in the deposition source supplier 150 and the concentration of the first organic material in the deposition layer is within 2%, that is, within the margin of error which is designed for the apparatus 100.

Therefore, even though the apparatus 100 is repeatedly used to deposit the first organic material and the second organic material on a plurality of substrates each being the same as the first substrate 11, after time elapses, the concentration of the first organic material and the concentration of the second organic material may be preserved to be similar to the original concentration of the first organic material and the original concentration of the second organic material. More specifically, referring to the Table 1, for example, when the apparatus 100 is actuated for 200 hours to deposit the first organic material and the second organic material on the first substrates 11, the concentration of the first organic material and the concentration of the second organic material that remained in the deposition source supplier 150 are 21.6% and 78.4%, respectively. These results are similar to the original concentration of the first organic material and the original concentration of the second organic material, and the margin of error thereof may be within 2%. Accordingly, even when an organic material is deposited on the first substrate 11, the apparatus 100 may enable the first organic material and the second organic material to be deposited on the first substrate 11 while maintaining a concentration ratio of the first organic material to the second organic material at a substantially coefficient level.

However, when the saturated vapor pressure is $1 \times 10^{-3}$ Torr, the first temperature is about 301.4° C. and the second temperature is about 312° C. Accordingly, the difference between the first temperature and the second temperature is about 10.6° C., which is a value greater than the 5° C. In this case, during deposition, the difference between the concentration of the first organic material and the concentration of the second organic material is widened, and as a result, the concentration of the first organic material to the ratio of the concentration of the second organic material included in the intermediate layer 18b on the first substrate 11 may change. In this case, when time elapses, the brightness or resolution of the display apparatus 10 may change, and thus, it is highly likely to manufacture a defective display apparatus. Accordingly, the first organic material and the second organic material having such formulae above may be available within a saturated vapor pressure range in a range from $3 \times 10^{-3}$ Torr to $1 \times 10^{-2}$ Torr. Embodiments are not limited thereto, and any organic materials may be used as the first organic material and the second organic material as long as, at a saturated vapor pressure in a range from $5 \times 10^{-4}$ Torr to $3 \times 10^{-2}$ Torr, the organic materials have a phase transition temperature difference of 5° C. or less.

An example of a method of confirming whether the mixture including the first organic material and the second organic material is able to be evaporated from a single deposition source supplier 150 will be described below.

First, the first organic material is provided to a thermogravimetric analyzer (TGA) and then, a temperature change per hour (for example, an incremental rate of 10° C./min) at TGA is set. The TGA may include, for example, a crucible to receive a sample, a weight measuring unit to measure the weight of the crucible, a heater surrounding the crucible to heat the crucible, a chamber located outside the crucible, and an intake unit that is connected to the chamber and maintains the inner pressure of the chamber to almost be in a vacuum state (for example, about $1 \times 10^{-4}$ Torr or less).

In the case of the TGA described above, initially, a temperature change with respect to time may be set at 5° C. In this case, the TGA may measure the initial weight of the first organic material, and a change in the weight of the first organic material with respect to a temperature change with respect to time. That is, the TGA may calculate, from the change in the weight of the first organic material, a weight change rate, that is, a weight change with respect to time as shown in the following equation.

$$\frac{d\Delta W}{dt} = \frac{d\Delta W}{dT}\frac{dT}{dt} \quad \text{[Equation 1]}$$

wherein W is the weight of an organic material, t is time, and T is the temperature of TGA. In this regard, dT/dt, which is a temperature change with respect to time in Equation 1, may be set initially as described above.

$$\frac{d\Delta W}{dT}$$

may be obtained by using measures obtained by using TGA and known equations.

Based on the weight change rate, an evaporation rate per unit area may be calculated by using the following equation.

$$m = \frac{1}{U}\frac{d\Delta W}{dt} \quad \text{[Equation 2]}$$

wherein m is an evaporation rate per unit area, and U is the area of the crucible of TGA (Ex, the area of the opening of the crucible).

Regarding the relationship between the evaporation rate per unit area and the saturated vapor pressure of an organic material, the following equation may be obtained from known Langmuir equation.

$$m = aP\left(\frac{M}{2\pi RT}\right)^{1/2} \quad \text{[Equation 3]}$$

wherein a is an evaporation coefficient of 1 or less, M is the molecular weight of an organic material, and R is the gas coefficient of 8.3145 J/K·mol.

The evaporation coefficient a may depend on the evaporation pressure or on whether other materials are mixed together. However, when one organic material is evaporated in a TGA, since an inner pressure of the chamber is almost vacuum and other materials are not mixed together, a may be assumed to be 1. Even regarding the same material, since a is the function of pressure, at the pressure of $1\times10^{-4}$ Torr or less, a may commonly be 1. Accordingly, only the curve of the saturated vapor pressure with respect to phase transition temperature when this condition is satisfied needs to be taken into consideration.

When a is assumed to be 1, an evaporation rate per unit area of an organic material may be calculated on the relationship between the temperature and weight loss of an organic material, which is obtained based on these results. In this regard, the relationship between the temperature and weight loss of an organic material may be calculated by using Equation 1.

FIG. 2 and FIG. 3 show the relationship between saturated vapor pressure and the temperature of an organic material may be calculated by using Equation 1, Equation 2, and Equation 3.

Referring to FIG. 2 and FIG. 3, the first organic material and the second organic material may have a coefficient relationship only within a saturated vapor pressure range of $5\times10^{-4}$ Torr to $3\times10^{-2}$ Torr. That is, it is seen that when the saturated vapor pressure is less than $5\times10^{-4}$ Torr or greater than $3\times10^{-2}$ Torr, the relationship between the saturated vapor pressure and temperature is not constant. In addition to the first organic material and the second organic material, other materials also show this relationship. Referring to FIG. 2, the first organic is material has an inflection point around about 360° C., and the second organic material has an inflection point around about 370° C. It is assumed that these inflection points occur due to thermal decomposition of the first and second organic materials. Each of the first organic material and the second organic material may phase-change when the saturated vapor pressure of FIG. 2 and FIG. 3 is within $5\times10^{-4}$ Torr to $3\times10^{-2}$ Torr.

Within the saturated vapor pressure range, as described above, even when at least two different organic materials are mixed, as long as a transition temperature difference is within 5° C., the mixture ratio of the at least two different organic materials may be maintained constant for a long period of time.

For example, in one embodiment in which two organic materials other than the first organic material and the second organic material are mixed, the results shown in Table 2 may be obtained. The results of Table 2 show a change in concentration of a third organic material and a fourth organic material when the third organic material and the fourth organic material are mixed in the deposition source supplier 150, and then, the mixture is deposited on the first substrate 11. In this regard, when a saturated vapor pressure of the third organic material and the fourth organic material is $3\times10^{-3}$ Torr, a phase transition temperature difference may be 3.4° C. The third organic material may be a green host including a 5p-type molecule, and the fourth organic material may be a green host including a 5n-type molecule.

TABLE 2

| Material | Concentration before vaporation (or sublimation) (%) | Quantity of the residual after 200 hours of deposition (%) |
|---|---|---|
| Third organic material | 50 | 49.6 |
| Fourth organic material | 50 | 50.4 |

These results show that when the phase-transition temperature difference at the same saturated vapor pressure is 5° C. or less, the quantity of the residual changes little even after the deposition.

Other than the materials, various other organic materials may be instead used. For example, in the case of two different organic materials (or two organic materials used as a green host) that have a phase-transition temperature difference of 0.55° C. at the same saturated vapor pressure, before deposition, the two different organic materials may respectively have concentrations of 69.9% and 30.1%, and after 200 hours of the deposition, the two different organic materials may respectively have concentrations of 69.8% and 30.2%.

Accordingly, in the same manner as described above, each of the at least two different organic materials was analyzed to confirm the relationship between saturated vapor pressure and transition temperature by using TGA. From obtained results, at least two different organic materials, each having the saturated vapor pressure of $5\times10^{-4}$ Torr to $3\times10^{-2}$ Torr and the transition temperature difference of 5° C. may be used for deposition. The at least two different organic materials may be simultaneously deposited on the first substrate 11, while being placed in the deposition source supplier 150.

Once the deposition process is completely performed on the first substrate 11, the pump 162 is actuated to maintain the inner pressure of the chamber 110 to be the same as the atmospheric pressure. When the gate valve 110a is actuated to open the chamber 110, the robotic arm may move the first substrate 11 to outside the chamber 110.

Accordingly, the apparatus 100 and the manufacturing method therefor enable concentrations of at least two organic materials to be mixed to be within the margin of error even when the organic materials are continuously, simultaneously deposited on the first substrate 11.

The apparatus 100 and the manufacturing method therefore enable the intermediate layer 18b of the OLED 18 to be uniformly formed even when a deposition process is continuously performed for a long time period. Accordingly, the apparatus 100 and the manufacturing method therefor may enable production of high-quality display apparatuses while a defect rate is minimized.

Referring to FIG. 3, the apparatus 100 may be used to form the intermediate layer 18b. Thereafter, an opposite electrode 18c is formed on the intermediate layer 18b, and then, an encapsulation portion is formed on the opposite electrode 18c to complete manufacturing the display apparatus 10. The encapsulation portion may include the thin-film encapsulation layer E or a second substrate (not shown).

The display apparatus 10 may include the first substrate 11 and an emission portion D. The display apparatus 10 may include, on the emission portion D, the thin-film encapsulation layer E or the second substrate. The second substrate is substantially the same as that used in a conventional display apparatus, and accordingly, a description thereof will be omitted. For ease of explanation, embodiments will be provided assuming that the display apparatus 10 includes the thin-film encapsulation layer E.

The emission portion D may include a thin film transistor TFT, a passivation film 17 covering the thin film transistor TFT, and the OLED 18 disposed on the passivation film 17.

The first substrate 11 may include a glass material. However, a material for forming the first substrate 11 is not limited thereto. For example, the first substrate 11 may include a plastic material, or a metallic material, such as SUS or Ti. In some embodiments, the first substrate 11 may include polyimide (PI). Hereinafter, for ease of explanation, embodiments will be provided below assuming that the first substrate 11 includes a glass material.

A buffer layer 12 may be formed on the first substrate 11. The buffer layer 12 may include an organic compound and/or an inorganic compound. For example, the buffer layer 12 may include $SiO_x(x\geq 1)$ or $SiN_x(x\geq 1)$.

An active layer 13 having a certain pattern may be formed on the buffer layer 12, and then, the active layer 13 is covered by a gate insulating layer 14. The active layer 13 includes a source region 13a, a drain region 13c, and a channel region 13b between the source region 13a and the drain region 13c.

The active layer 13 may include various materials. For example, the active layer 13 may include an inorganic semiconductor material, such as amorphous silicon or crystalline silicon. In some embodiments, the active layer 13 may include an oxide semiconductor. In some embodiments, the active layer 13 may include an organic semiconductor material.

The active layer 13 may be formed such a manner that an amorphous silicon film is formed on the buffer layer 12, and then, crystallized to form a polycrystalline silicon film, which is then patterned. According to a thin film transistor, that is, according to whether the thin film transistor is a driving thin film transistor (not shown) or a switching thin film transistor (not shown), the source region 13a and the drain region 13c of the active layer 13 which contact a source electrode and a drain electrode of the TFT are doped with corresponding impurities.

A gate electrode 15 is formed on the gate insulating layer 14, corresponding to the active layer 13, and an interlayer insulating layer 16 covers the gate electrode 15.

A contact hole H1 is formed in each of the interlayer insulating layer 16 and the gate insulating layer 14, and then, a source electrode 17a and a drain electrode 17b are formed on the interlayer insulating layer 16 in such a manner that the source electrode 17a and the drain electrode 17b contact the source region 13a and the drain region 13c, respectively.

The passivation film 17 is formed on the thin film transistor TFT, and a pixel is electrode 18a of the OLED 18 is formed on the passivation film 17. The pixel electrode 18a contacts the drain electrode 17b of the thin film transistor via a via-hole H2 formed in the passivation film 17. The passivation film 17 may include at least one of an inorganic material and an organic material, and may have a single-layer structure or a multi-layer structure including two or more layers. In some embodiments, the passivation film 17 may be a planarization layer that has a flat top surface although an underlying layer thereof is not flat. In some embodiments, the passivation film 17 may conform to an underlying layer thereof, so if the underlying layer is bent, the passivation film 17 is also bent. To obtain a resonance effect, the passivation film 17 may include a transparent insulating material.

After the pixel electrode 18a is formed on the passivation film 17, a pixel defining-film 19 is formed covering the pixel electrode 18a and the passivation film 17. The pixel defining-film 19 may include an organic material and/or an inorganic material. The pixel defining-film 19 is open such that the pixel electrode 18a is exposed.

The intermediate layer 18b and an opposite electrode 18c are formed on the pixel electrode 18a.

The pixel electrode 18a may function as an anode and the opposite electrode 18c may function as a cathode. However, in some embodiments, the pixel electrode 18a may function as a cathode and the opposite electrode 18c may function as an anode.

The pixel electrode 18a and the opposite electrode 18c may be insulated from each other by the intermediate layer 18b, and voltages having different polarities are applied to the intermediate layer 18b to allow an organic emission layer to emit light.

The intermediate layer 18b may include the organic emission layer. In optional embodiments, the intermediate layer 18b may include an organic emission layer, and additionally, as a common layer (not shown), at least one layer selected from a hole injection layer, a hole transport layer, an electron transport layer, and an electron injection layer.

Layers constituting the intermediate layer 18b may each include at least two organic materials, such as the first organic material and the second organic material, wherein the organic materials are present in a mixed state. The at least two organic materials may have different phase transition temperatures, and the difference between the phase transition temperatures is 5° C. or less at a certain saturated vapor pressure (the first saturated vapor pressure) of $5\times10^{-4}$ Torr to $3\times10^{-2}$ Torr. For example, at least one of the organic emission layer and the common layer may include at least two or more organic materials in a mixed state. For example, only the organic emission layer may include at least two or more organic materials in a mixed state. For example, only the common layer may include at least two or more organic materials in a mixed state. In this regard, from among layers constituting the common layer, at least one layer may include at least two or more organic materials in a mixed state. In some embodiments, each of the organic emission layer and the common layer may include at least two or more organic materials in a mixed state. However, for ease of explanation, embodiments will be provided assuming that the organic emission layer includes the first organic material and the second organic material. A single unit pixel includes a plurality of sub-pixels, which emit various light colors. For example, the sub-pixels may include a sub-pixel emitting red light, a sub-pixel emitting green light, and a sub-pixel emitting blue light, or the sub-pixels may include a sub-pixel emitting red light, a sub-pixel emitting green light, a sub-pixel emitting blue light, and a sub-pixel emitting white light.

The thin-film encapsulation layer E may include a plurality of inorganic layers, or may include an inorganic layer and an organic layer.

The organic layer of the thin-film encapsulation layer E may include a polymer. For example, the organic layer may be a single film or a stack film including at least one selected from polyethylene terephthalate, polyimide, polycarbonate, epoxy, polyethylene, and polyacrylate. For example, the organic layer may include polyacrylate, or a polymer obtained by polymerizing a monomer composition including a diacrylate-based monomer and a triacrylate-based monomer. The monomer composition may further include a monoacrylate-based monomer. The monomer composition may further include a known photo-initiator, such as 2,4,6-trimethylbenzoylphosphineoxide (TPO). However, embodiments are not limited thereto.

The inorganic layer of the thin-film encapsulation layer E may be a single film or a stack film, including metal oxide or metal nitride. For example, the inorganic layer may include any one of $SiN_x$, $Al_2O_3$, $SiO_2$, and $TiO_2$.

From among layers constituting the thin-film encapsulation layer E, the uppermost layer exposed to the outside of the display apparatus 10 may include an inorganic layer to prevent permeation of moisture into the OLED 18.

The thin-film encapsulation layer E may include at least one sandwich structure including at least one organic layer between at least two inorganic layers. In some embodiments, the thin-film encapsulation layer E may include at least one sandwich structure including at least one inorganic layer between at least two organic layers. In some embodiments, the thin-film encapsulation layer E may include a sandwich structure including at least one organic layer between at least two inorganic layers and a sandwich structure including at least one inorganic layer between at least two organic layers.

The thin-film encapsulation layer E may include a first inorganic layer, a first organic layer, and a second inorganic layer, which are sequentially formed on the OLED 18 in this stated order.

In some embodiments, the thin-film encapsulation layer E may include the first inorganic layer, the first organic layer, the second inorganic layer, a second organic layer, and a third inorganic layer, which are sequentially formed on the OLED 18 in this stated order.

In some embodiments, the thin-film encapsulation layer E may include the first inorganic layer, the first organic layer, the second inorganic layer, the second organic layer, the third inorganic layer, a third organic layer, and a fourth inorganic layer, which are sequentially formed on the OLED 18 in this stated order.

A halogenated metal layer containing LiF may be additionally included between the OLED 18 and the first inorganic layer. The halogenated metal layer may protect the OLED 18 when the first inorganic layer is formed by sputtering.

The area of the first organic layer may be smaller than that of the second inorganic layer, and the area of the second organic layer may be smaller than that of the third inorganic layer.

Accordingly, the quality of the display apparatus 10 may be maintained at a high level. Also, due to the inclusion of the intermediate layer 18b including organic materials, of which a designed concentration ratio is maintained constant, the display apparatus 10 may embody high luminous efficiency.

A display apparatus, and an apparatus and method of manufacturing the display apparatus according to embodiments allow a display apparatus to accurately embody an image.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display apparatus, comprising:
an emission portion disposed on a substrate, the emission portion comprising an intermediate layer; and
an encapsulation portion sealing the emission portion by overlapping the emission portion,
wherein the intermediate layer comprises at least two organic materials, the organic materials having different phase transition temperatures at a first saturated vapor pressure in a range from $5 \times 10^{-4}$ Torr to $3 \times 10^{-2}$ Torr, and the difference between the phase transition temperatures less than or equal to 5° C.

2. The display apparatus of claim 1, wherein, from among the at least two organic materials, at least one organic material is a vaporizable material that vaporizes from a liquid state to a gas state.

3. The display apparatus of claim 1, wherein, from among the at least two organic materials, at least one organic material is a sublimation material that sublimates from a solid state to a gas state.

4. The display apparatus of claim 1, wherein the intermediate layer comprises an organic emission layer.

5. The display apparatus of claim 4, wherein the intermediate layer further comprises at least one layer selected from a hole injection layer, a hole transport layer, an electron transport layer, and an electron injection layer.

6. The display apparatus of claim 1, wherein the first saturated vapor pressure is in a range from $3 \times 10^{-3}$ Torr to $1 \times 10^{-2}$ Torr.

7. An apparatus for manufacturing a display apparatus, comprising:
a chamber comprising a support for a substrate therein; and
a deposition source supplier provided to face the substrate, the deposition source supplier providing at least two organic materials to the substrate,
wherein the at least two organic materials have different phase transition temperatures at a first saturated vapor pressure in a range from $5 \times 10^{-4}$ Torr to $3 \times 10^{-2}$ Torr, and the difference between the phase transition temperatures is less than or equal to 5° C.

8. The apparatus of claim 7, wherein from among the at least two organic materials, at least one organic material is a vaporizable material that vaporizes from a liquid state to a gas state.

9. The apparatus of claim 7, wherein from among the at least two organic materials, at least one organic material is a sublimation material that sublimates from a solid state to a gas state.

10. The apparatus of claim 7, wherein at least one of the substrate and the deposition source supplier is configured for a linear motion.

11. The apparatus of claim 7, wherein the first saturated vapor pressure is in a range from $3 \times 10^{-3}$ Torr to $1 \times 10^{-2}$ Torr.

12. A method of manufacturing a display apparatus, the method comprising:
allowing a substrate to enter a chamber;
heating a deposition source supplier to supply at least two organic materials inside the chamber; and
depositing the at least two organic materials on the substrate to form an intermediate layer,
wherein the at least two organic materials have different phase transition temperatures at a first saturated vapor pressure in a range from $5 \times 10^{-4}$ Torr to $3 \times 10^{-2}$ Torr, and the difference between the phase transition temperatures is less than or equal to 5° C.

13. The method of claim 12, wherein, from among the at least two organic materials, at least one organic material is a vaporizable material that vaporizes from a liquid state to a gas state.

14. The method of claim 12, wherein, from among the at least two organic materials, at least one organic material is a sublimation material that sublimates from a solid state to a gas state.

15. The method of claim 12, wherein at least one of the substrate and the deposition source supplier performs a linear motion.

16. The method of claim 12, wherein, from among the at least two organic materials, one organic material has a concentration ratio in a range from 0.1% to 50% by weight.

17. The method of claim 12, wherein the intermediate layer comprises an organic emission layer.

18. The method of claim 17, wherein the intermediate layer further comprises at least one of a hole injection layer, a hole transport layer, an electron transport layer, and an electron injection layer.

19. The method of claim 12, wherein the first saturated vapor pressure is in a range from $3\times10^{-3}$ Torr to $1\times10^{-2}$ Torr.

* * * * *